United States Patent
Okamoto et al.

(10) Patent No.: US 12,041,740 B2
(45) Date of Patent: Jul. 16, 2024

(54) WATERPROOF CASE FOR AUTOMOBILE COMPONENTS

(71) Applicants: DENSO CORPORATION, Kariya (JP); ThreeBond CO., Ltd., Hachioji (JP)

(72) Inventors: Shinichi Okamoto, Kariya (JP); Yuka Taniguchi, Kariya (JP); Akihisa Kurokawa, Kariya (JP); Takanori Wachi, Hachioji (JP); Yasutoshi Nogami, Hachioji (JP)

(73) Assignees: DENSO CORPORATION, Kariya (JP); ThreeBond CO., Ltd., Hachioji (JP)

( * ) Notice: Subject to any disclaimer, the term of this patent is extended or adjusted under 35 U.S.C. 154(b) by 520 days.

(21) Appl. No.: 17/244,046

(22) Filed: Apr. 29, 2021

(65) Prior Publication Data

US 2021/0251094 A1 Aug. 12, 2021
US 2022/0015254 A2 Jan. 13, 2022

Related U.S. Application Data

(63) Continuation of application No. PCT/JP2019/037357, filed on Sep. 24, 2019.

(30) Foreign Application Priority Data

Oct. 31, 2018 (JP) .................................. 2018-205087

(51) Int. Cl.
*H05K 5/06* (2006.01)

(52) U.S. Cl.
CPC ............. *H05K 5/062* (2013.01); *H05K 5/061* (2013.01)

(58) Field of Classification Search
CPC ........... H05K 5/06; H05K 5/061; H05K 5/062
See application file for complete search history.

(56) References Cited

U.S. PATENT DOCUMENTS

| 5,340,847 | A | 8/1994 | Hanazuka et al. | |
|---|---|---|---|---|
| 6,407,925 | B1 * | 6/2002 | Kobayashi | H05K 5/0052 361/752 |
| 8,520,397 | B2 * | 8/2013 | Azumi | H05K 5/0069 361/752 |
| 9,559,503 | B2 * | 1/2017 | Kawamura | H02G 3/081 |

(Continued)

FOREIGN PATENT DOCUMENTS

| JP | H05125284 A | 5/1993 |
|---|---|---|
| JP | H0788430 A | 4/1995 |

(Continued)

*Primary Examiner* — Daniel J Rohrhoff
(74) *Attorney, Agent, or Firm* — Harness, Dickey & Pierce, P.L.C.

(57) ABSTRACT

A waterproof case for automobile components includes: a case body part that includes a storage space for housing an object and an opening connecting to the storage space; and a lid part that is configured to be attached to the case body part to close the opening. A seal material (made of an adhesive silicone gel is interposed between the case body part and the lid part. An acceptance part is provided in at least one of the case body part and the lid part. An engagement convex part is configured to be locked in the acceptance part at a position corresponding to the acceptance part in the case body part and the lid part.

8 Claims, 2 Drawing Sheets

(56) References Cited

U.S. PATENT DOCUMENTS

| | | | | |
|---|---|---|---|---|
| 9,723,740 | B2 * | 8/2017 | Yang | B60R 16/023 |
| 2004/0188120 | A1 * | 9/2004 | Komatsu | H05K 9/0073 |
| | | | | 174/17 CT |
| 2006/0023431 | A1 * | 2/2006 | Wetzel | H05K 5/0082 |
| | | | | 257/E23.185 |
| 2009/0008885 | A1 * | 1/2009 | Kanagae | C08G 18/77 |
| | | | | 277/650 |
| 2009/0253027 | A1 * | 10/2009 | Yang | H01M 50/262 |
| | | | | 429/61 |
| 2013/0292383 | A1 * | 11/2013 | Mullaney | H05K 5/062 |
| | | | | 277/654 |
| 2013/0303651 | A1 | 11/2013 | Nakatani et al. | |
| 2015/0146347 | A1 * | 5/2015 | Lee | H05K 5/0052 |
| | | | | 361/679.01 |
| 2015/0377355 | A1 * | 12/2015 | Coenegracht | G02B 6/4444 |
| | | | | 312/223.4 |
| 2016/0262272 | A1 * | 9/2016 | Oba | H05K 5/0052 |
| 2017/0013737 | A1 * | 1/2017 | Kawabe | H02B 1/28 |
| 2017/0276247 | A1 * | 9/2017 | Aromin | F16J 15/062 |
| 2019/0306998 | A1 * | 10/2019 | Malecke | H01R 13/518 |
| 2021/0273371 | A1 * | 9/2021 | Sumida | H05K 5/0069 |
| 2022/0167518 | A1 * | 5/2022 | Mayer | H05K 7/1432 |
| 2022/0316597 | A1 * | 10/2022 | Hsiao | F16J 15/441 |
| 2023/0124007 | A1 * | 4/2023 | Wang | B65D 43/0216 |
| | | | | 220/797 |

FOREIGN PATENT DOCUMENTS

| | | |
|---|---|---|
| JP | H08316653 A | 11/1996 |
| JP | 2001525985 A | 12/2001 |
| JP | 2005093602 A | 4/2005 |
| JP | 2013237845 A | 11/2013 |
| JP | 2014027773 A | 2/2014 |
| JP | 2014063868 A | 4/2014 |

* cited by examiner

WATERPROOF CASE FOR AUTOMOBILE COMPONENTS

CROSS-REFERENCE TO RELATED APPLICATION

The present application is a continuation application of International Application No. PCT/JP2019/037357, filed on Sep. 24, 2019, which claims priority to Japanese Patent Application No. 2018-205087, filed on Oct. 31, 2018. The contents of these applications are incorporated herein by reference in their entirety.

BACKGROUND

1. Technical Field

The present disclosure relates to a waterproof case for automobile components.

2. Related Art

The engine compartment in an automobile stores electrical components, for example, an engine ECU (that is, an electronic control unit), a flow path switching valve, an electronic throttle, a battery pack, a power control unit, a camera for recognition of white lines and others, and a LiDAR (that is, light detection and ranging) sensor. These electrical components include objects to be stored such as electronic parts, sensors, and gears, and a case for housing the objects. The case has a storage space for housing the objects, a case body part with an opening connecting to the storage space, a lid part that closes the opening in the case body part, and a seal material that is interposed between the case body part and the lid part to seal the gap between the two parts in a liquid-tight manner.

SUMMARY

The present disclosure provides a waterproof case for automobile components. An aspect of the present disclosure is a waterproof case for automobile components including a case body part, a lid part, a seal material, an acceptance part, and an engagement convex part. The case body part includes a storage space for housing an object and an opening connecting to the storage space. The lid part is configured to be attached to the case body part to close the opening. The seal material is made of an adhesive silicone gel and is interposed between the case body part and the lid part. The acceptance part is provided in at least one of the case body part and the lid part. The engagement convex part is provided at a position corresponding to the acceptance part in the case body part and the lid part and is configured to be locked in the acceptance part.

DETAILED DESCRIPTION OF THE PREFERRED EMBODIMENTS

Figure 1:
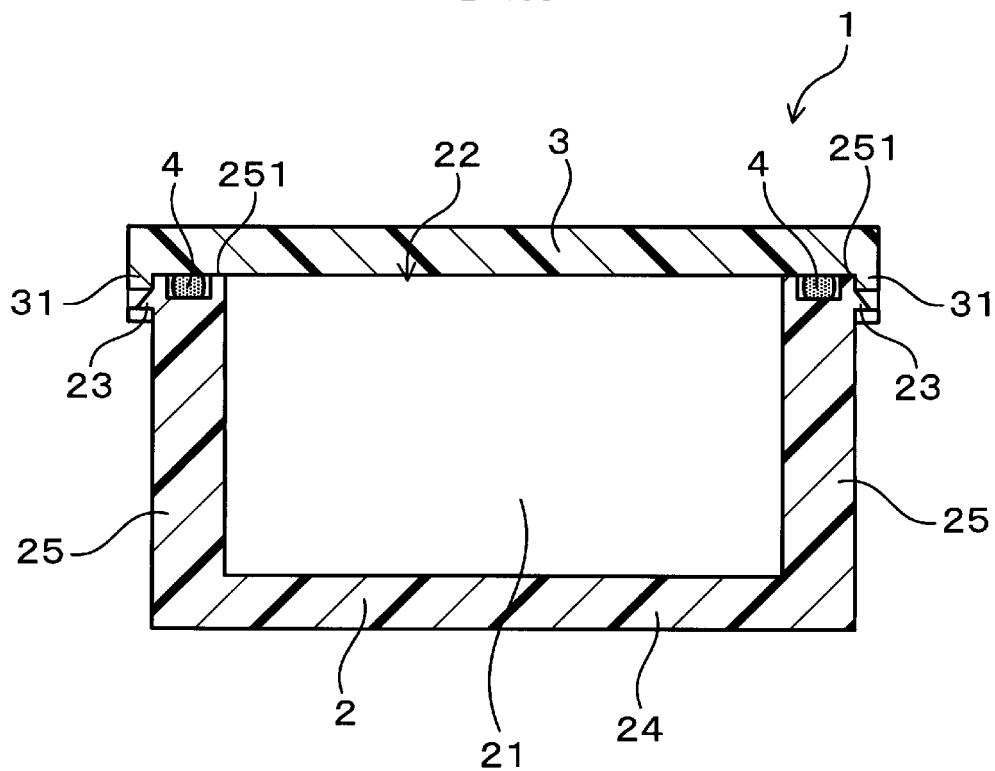
FIG. 1 is a cross-sectional view of parts of a waterproof case in a first embodiment.

The seal material is conventionally a rubber gasket such as an O-ring or packing. For example, JP 2001-525985 A (hereinafter referred to as "PTL 1") describes a technology for applying a heatable seal material made of a butyl rubber to the seal surface of at least one of two casing parts.

In recent years, a liquid gasket may be used as a seal material formed by applying a liquid curable composition to a desired part and curing it on the desired part.

Otherwise, the case body part and the lid part may be adhered to each other with an adhesive to seal the gap between the case body part and the lid part in a liquid-tight manner.

In the case of using a rubber gasket as described in PTL 1 or a liquid gasket as a seal material, in order to seal the gap between the case body part and the lid part in a liquid-tight manner, it is necessary to fasten the lid part to the case body part via fastening members such as bolts to sufficiently compress the gasket interposed between the two parts. This causes parts cost for the fastening members and operating cost for the fastening work, which will hinder cost reduction of the electrical components.

In the case of using an O-ring or packing as a seal material, these components need to be arranged manually. This may result in further increase in the cost of the electrical components.

On the other hand, adhering the case body part and the lid part to each other with an adhesive eliminates the work of fastening the lid part and the case body part and the use of the fastening members for fastening them. In this case, however, after the adhesion of the lid part to the case body part, if there arises a necessity for removing the lid part from the case body part for some reason, the cured adhesive has to be broken. In order to avoid such problems, there is demand for a seal material that, after the attachment of the lid part to the case body part, allows the lid part to be removed from the case body part and then re-assembled to the case body part.

In addition, since the engine generates a large amount of heat in the engine compartment, the temperature in the engine compartment varies widely from an ambient temperature to a high temperature during operation of the engine. Thus, this kind of seal material is required to have high heat-resistance properties as well as waterproof performance.

The present disclosure is directed to providing a waterproof case for automobile components that reduces the cost of assembly work, allows for re-assembly, and is excellent in heat-resistance properties and waterproof performance.

An aspect of the present disclosure is in a waterproof case for automobile components, including: a case body part that includes a storage space for housing an object and an opening connecting to the storage space; a lid part that is configured to be attached to the case body part to close the opening; a seal material that is made of an adhesive silicone gel and is interposed between the case body part and the lid part; an acceptance part that is provided in at least one of the case body part and the lid part; and an engagement convex part that is provided at a position corresponding to the acceptance part in the case body part and the lid part and is configured to be locked in the acceptance part.

The waterproof case for the automobile components (hereinafter, referred to as simply "waterproof case") has the case body part with the storage space and the lid part attached to the case body part. The acceptance part is provided in at least one of the case body part and the lid part. The engagement convex part is provided in the case body part and the lid part at the position corresponding to the acceptance part, and is retained in the acceptance part. That is, the case body part and the lid part are locked to each other by snap-fitting.

The waterproof case allows the lid part to be attached to the case body part by a simple action of pushing the engagement convex part into the acceptance part. The waterproof case also allows the lid part to be attached to the case body part without the use of fastening members such as bolts. Therefore, according to the waterproof case, it is possible to reduce the parts cost for fastening members and the operating cost for attaching the lid part to the case body part.

The seal material made of an adhesive silicone gel is interposed between the case body part and the lid part. When the lid part is attached to the case body part, the seal material adheres to both parts to close the gap between the seal material and the lid part and the gap between the seal material and the case body part. This seals the gap between the lid part and the case body part in a liquid-tight manner. Further, the silicone gel is highly heat-resistant and can maintain waterproof performance in the engine compartment for a long time period.

The waterproof case allows the case body part and the lid part to be locked to each other by snap-fitting, and uses an adhesive silicone gel as the seal material to, after the attachment of the lid part to the case body part, allow the lid part to be easily removed from the case body part. Further, after the removal of the lid part from the case body part, when the waterproof case is attached again to the case body part, the seal material can seal the gap between the two parts in a liquid-tight manner.

As stated above, according to the aspect, it is possible to provide a waterproof case for an automobile that reduces a cost of assembly work, allows for re-assembly, and is excellent in heat-resistance properties and waterproof performance.

The reference signs within parentheses described in the claims indicate correspondence with specific means in embodiments described later, and do not limit the technical scope of the present disclosure.

The foregoing and other objects, features, and advantages of the present disclosure will be further clarified by the following detailed description with reference to the accompanying drawings.

First Embodiment

An embodiment related to the waterproof case will be described with reference to FIGS. 1 and 2. As shown in FIG. 1, the waterproof case 1 in the present embodiment has a case body part 2 that includes a storage space 21 for housing objects and an opening 22 connecting to the storage space 21, and a lid part 3 that is attached to the case body part 2 to close the opening 22. A seal material 4 made of an adhesive silicone gel is interposed between the case body part 2 and the lid part 3. Acceptance parts 31 are provided in at least one of the case body part 2 and the lid part 3. Engagement convex parts 23 are locked in the acceptance parts 31 at positions corresponding to the acceptance parts 31 in the case body part 2 and the lid part 3.

The shape and structure of the waterproof case 1 are not particularly limited. For example, the waterproof case 1 may have one storage space 21 surrounded by the case body part 2 and the lid part 3 or may have two or more storage spaces 21. In addition, one or two or more openings 22 may connect to the storage space 21.

Although not illustrated in the drawings, the waterproof case 1 in the present embodiment is, for example, in the shape of a rectangular parallelepiped. As illustrated in FIG. 1, the case body part 2 has a bottom wall 24, a side wall 25 erected from the outer peripheral edge of the bottom wall 24, and the storage space 21 surrounded by the bottom wall 24 and the side wall 25. The waterproof case 1 also has the opening 22 surrounded by a leading end 251 of the side wall 25.

Figure 2:
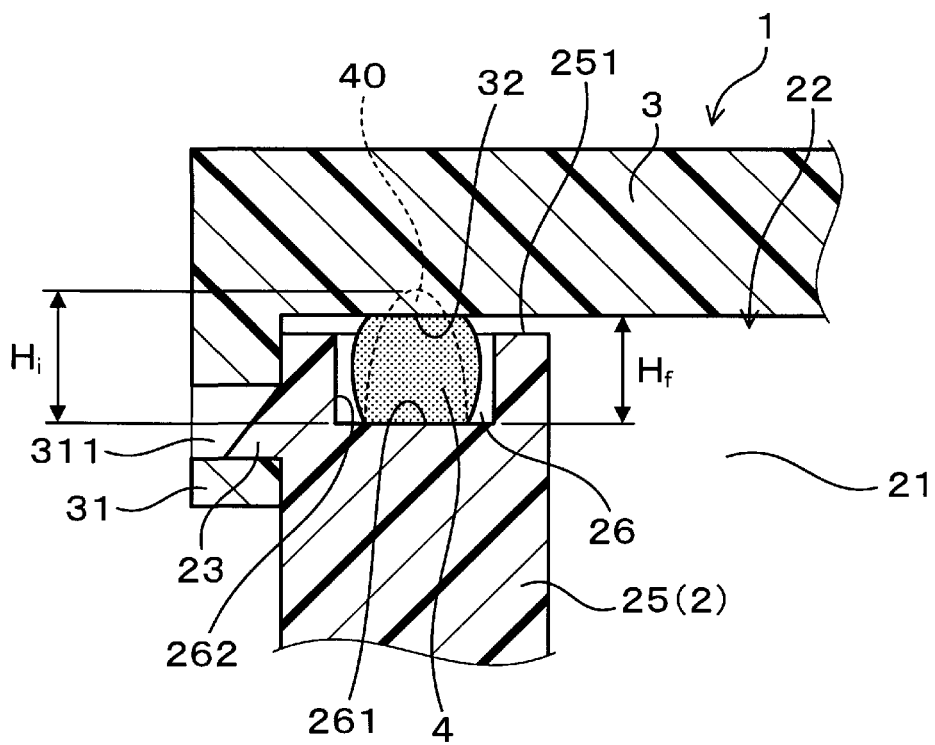
FIG. 2 is a partial enlarged view of a seal material illustrated in FIG. 1.

As illustrated in FIG. 2, the case body part 2 in the present embodiment has, at the leading end 251 of the side wall 25, a seal material retaining groove 26 including a bottom surface 261 and a side surface 262 connecting to the bottom surface 261. The seal material retaining groove 26 is provided over the entire circumference of the leading end 251 of the side wall 25. The seal material 4 is arranged on the bottom surface 261 of the seal material retaining groove 26.

As illustrated in FIG. 1, there is provided a plurality of engagement convex parts 23 protruding outward from the outer surface of the side wall 25. These engagement convex parts 23 are inserted into acceptance holes 311 of the acceptance parts 31 described later. Thus, the engagement convex parts 23 become locked in the acceptance parts 31.

The case body part 2 in the present embodiment is configured to store objects to be stored in the storage space 21. The objects to be stored in the storage space 21 include, for example, electronic devices such as electronic circuits, sensors, and motors, and drive parts such as gears.

The opening 22 in the case body part 2 is covered by the lid part 3. The lid part 3 in the present embodiment is flat plate-like, and has a seal surface 32 to contact the seal material 4 on the outer peripheral edge as illustrated in FIG. 2. The lid part 3 has, at its edge, the plurality of acceptance parts 31 extending toward the case body part 2. Although not illustrated in the drawings, the acceptance parts 31 in the present embodiment are annular in shape. The acceptance parts 31 have the acceptance holes 311 for accepting the engagement convex parts 23 as illustrated in FIG. 2. The engagement convex parts 23 are inserted into the acceptance holes 311.

The case body part 2 and the lid part 3 may be made of, for example, a metal such as iron or aluminum, or a resin such as engineering plastic or super engineering plastic. From the viewpoint of weight reduction of the waterproof case 1, preferably, at least one of the case body part 2 and the lid part 3 is made of a resin, and more preferably, both are made of a resin. The case body part 2 and the lid part 3 in the present embodiment are both made of a polyamide-based resin.

In the present embodiment, the gap between the case body part 2 and the lid part 3 is sealed in a liquid-tight manner by an adhesive silicone gel used as the seal material 4. The silicone gel is much softer than rubber gaskets such as an O-ring, which reduces a pressure required to be applied to the seal material 4 as compared to the conventional waterproof case 1 with a rubber gasket for sealing. Thus, even if a resin lower in stiffness than metal is used for the case body part 2 and the lid part 3, the seal material 4 can be sufficiently compressed to ensure waterproof performance.

As illustrated in FIGS. 1 and 2, the seal material 4 made of an adhesive silicone gel is interposed between the case body part 2 and the lid part 3. As illustrated in FIG. 2, the seal material 4 is arranged on the bottom surface 261 of the seal material retaining groove 26. With the lid part 3 not attached to the case body part 2 (indicated with reference sign 40), the seal material 4 has an angle-shaped cross section with the width-wise center protruding beyond the leading end 251 of the side wall 25 as shown by a dashed line in FIG. 2. With the lid part 3 attached to the case body part 2, the seal material 4 is compressed by the seal surface 32 of the lid part 3 as shown by a solid line in FIG. 2.

The silicone gel here refers to a gel containing a polysiloxane polymer. The silicone gel is preferably a silicone gel made by curing a composite containing a curable organopolysiloxane compound. Hereinafter, for the distinction between before and after curing, the material in a pre-curing state, that is, in a liquid state at 25° C. will be referred to as silicone composition.

The viscosity of the silicone composition at 25° C. is preferably in a range of 200 Pa·s or more and 600 Pa·s or less, and the thixotropic ratio of the silicone composition at 25° C. is preferably in a range of 2.5 or more and 4.5 or less. This improves the applicability of the silicone composition.

The silicone composition becomes a silicone gel by polymerizing a functionalized organopolysiloxane compound by reaction with heat, moisture, light or the like. The silicone gel is adhesive, that is, has a property of sticking when being simply pressed.

The silicone composition may be, for example, a thermosetting silicone composition, a moisture-curable silicone composition, or a photo-curable silicone composition. The silicone composition is particularly preferably a photo-curable silicone composition.

Examples of the thermosetting silicone composition may include, but are not limited to, a composition containing polyorganosiloxane having a vinylsiloxane group and a peroxide, polyorganosiloxane having a vinylsiloxane group, a composition containing a hydrogensiloxane compound and a hydrosilylation metallic catalyst, a composition containing a polyorganosiloxane having an epoxy group and a thermal cationic catalyst, and the like.

Examples of the moisture-curable silicone composition include, but are not limited to, polyorganosiloxane having a hydrolyzable silyl group, a composition containing a silane-based coupling agent and a condensation catalyst, polyorganosiloxane having an isocyanate group, a composition containing a polyol compound and a condensation catalyst, and the like.

Examples of the photo-curable silicone composition include, but are not limited to, polyorganosiloxane having a (meth)acrylic group and a radical photo initiator, polyorganosiloxane having a vinylsiloxane group, a composition containing a polythiol compound and a radical photo initiator, a composition containing polyorganosiloxane having an epoxy group and a photo cationic catalyst, and the like.

The thermosetting silicone composition, the moisture-curable silicone composition, and the photo-curable silicone composition may be formed from one component or two or more components. From the viewpoint of forming the seal material 4 it on the spot, the photo-curable silicone composition is preferably used because it can be cured at a low temperature in a short time by a device such as an ultraviolet irradiator or an LED irradiator.

The hardness of the silicone gel can be expressed by durometer hardness obtained by a Type-E durometer specified in JIS K6253-3: 2012. The hardness of the seal material 4 measured by pressing the type-E durometer with a load of 1 kg is preferably in a range of 5 or more and 30 or less. In this case, when the lid part 3 is attached to the case body part 2 and the seal material 4 is compressed, the repulsive force of the seal material 4 can be appropriately increased. This further enhances waterproof performance of the waterproof case 1.

The tensile shear strength of the seal material 4 is preferably 0.02 MPa or more. In this case, when the lid part 3 is attached to the case body part 2 and the seal material 4 is compressed, the adhesion of the seal material 4 to the lid part 3 and the adhesion of the seal material 4 to the case body part 2 can be more increased to further enhance the waterproof performance of the waterproof case 1.

From the viewpoint of further enhancing the waterproof performance of the waterproof case 1, the seal material 4 is preferably a silicone gel obtained by curing a photo-curable silicone composition containing polyorganosiloxane having a vinylsiloxane group, a thiol cross-linking agent, and a radical photoinitiator.

The molecular structure of the polyorganosiloxane having a vinylsiloxane group is preferably linear but may be a branched structure. Examples of the polyorganosiloxane include, but are not limited to, dimethylsiloxane having molecular chain ends blocked with dimethylvinylsiloxy groups, dimethyl siloxane-diphenylsiloxane copolymer having molecular chain ends blocked with dimethylvinylsiloxy groups, dimethylsiloxane-methylvinylsiloxane-diphenylsiloxane copolymer having molecular chain ends blocked with dimethylvinylsiloxy groups, dimethylsiloxane having one molecular chain end blocked with a dimethylvinylsiloxy group and the other molecular chain end blocked with a trimethyl siloxy group, methylvinyl siloxane-diphenyl siloxane, dimethyl siloxane-methylvinylsiloxane copolymer having both molecular chain ends blocked with trimethylsiloxy groups, a dimethylsiloxane-methylvinylsiloxane-diphenylsiloxane copolymer having both molecular chain ends blocked with trimethylsiloxy groups, and the like. They may be used singly or in combination of two or more of them.

The thiol cross-linking agent may be a polythiol compound, for example. Examples of the polythiol compound include, but are not limited to, trimethylolpropane tris(3-mercaptopropionate), pentaerythritoltetrakis(3-mercaptopropionate), trimethylolpropane tris(3-mercaptobutyrate), trimethylolethanetris(3-mercaptobutyrate), ethyleneglycol bis(3-mercaptoglycolate), butanediol bis(3-mercaptoglycolate), trimethylolpropane tris(3-mercaptoglycolate), pentaerythritol tetrakis(3-mercaptoglycolate), tris-[(3-mercaptopropionyloxy)-ethyl]-isocyanurate, pentaerythritol tetrakis(3-mercaptopropionate), tetraethyleneglycolbis(3-mercaptopropionate), dipentaerythritol hexakis(3-mercaptopropionate), pentaerythritoltetrakis(3-mercaptobutyrate), 1,4-bis(3-mercaptobutyryloxy)butane, polyorganosiloxane having a mercapto group, polysulfide polymer having a mercapto group, and the like. They may be used singly or in combination of two or more of them. The use of the seal material 4 containing a thiol cross-linking agent further increases the adhesion of the seal material 4 to the lid part 3 and the adhesion of the seal material 4 to the case body part 2, thereby further enhancing the waterproof performance of the waterproof case 1. The thiol cross-linking agent is preferably a polythiol compound having two or more thiol groups (mercapto groups) in one molecule.

The seal material 4 may contain, as a thiol cross-linking agent, one or more compounds in a group composed of compounds having thiol groups. The content of the thiol cross-linking agent in the silicone composition can be selected as appropriate from a range of 0.10 mass % or more and 10.0 mass % or less, for example. From the viewpoint of further increasing the adhesion of the seal material 4 to the lid part 3 and the adhesion of the seal material 4 to the case body part 2, the content of the thiol cross-linking agent is more preferably in a range of 0.50 mass % or more and 5.0 mass % or less.

There is no particular limitation on the radical photoinitiator as far as it is a compound that facilitates a reaction between the vinylsiloxane group and the thiol group by light irradiation. Examples of the radical photoinitiator include, but are not limited to, 1-hydroxy-cyclohexyl-phenyl-ketone, 2,2-dimethoxy-2-phenylacetophenone, xanthone, fluorenone, benzaldehyde, fluorene, anthraquinone, triphenylamine, carbazole, 3-methyl acetophenone, 4-chlorobenzophenone, 4,4'-dimethoxybenzophenone, 4,4'-diaminobenzophenone, Michler's ketone, benzoinpropylether, benzoinethylether, benzildimethylketal, 1-(4-isopropylphenyl)-2-hydroxy-2-methylpropane-1-one, 2-hydroxy-2-methyl-1-phenylpropane-1-one, thioxanthone, diethylthioxanthone, 2-isopropylthioxanthone, 2-chlorothioxanthone, 2-methy-1[4-(methylthio)phenyl]-2-morpholino-propan-1-one, 2,4,6-trimethylbenzoyldiphenylphosphine oxide, bis-(2,6-dimethoxybenzoyl)-2,4,4-trimethylpentylphosphine oxide, and the like. These photoinitiators may be used singly or in combination of two or more of them.

The silicone composition may further contain a filler. Examples of the filler include, but are not limited to, inorganic fillers such as calcium carbonate powder, silica powder, fumed silica powder, talc powder, aluminum hydroxide powder, and glass beads, organic fillers such as polystyrene powder, polyurethane powder, acryl powder, silicone rubber powder, silicone resin powder, and the like.

The silicone composition can further be mixed with a pigment, coloring agent, plasticizer, flame retarder, oxidant inhibitor, polymerization inhibitor, anti-foaming agent, coupling agent, leveling agent, rheology control agent, and the like provided that the characteristics of the silicone composition are not deteriorated. The addition of these other components results in a composition excellent in resin strength, adhesion strength, workability, and preservability, and its hardened product.

The seal material 4 in the present embodiment is arranged on the bottom surface 261 of the seal material retaining groove 26 and is compressed by the bottom surface 261 and the seal surface 32 of the lid part 3. There is a clearance left between the side surface 262 of the seal material retaining groove 26 and the seal material 4. Arranging the seal material 4 in this manner ensures the clearance for deforming the seal material 4 when the lid part 3 is attached to the case body part 2. This avoids excessive increase in the repulsive force of the seal material 4 when the seal material 4 is compressed. Consequently, it is possible to avoid excessive increase in the load applied to the acceptance parts 31 and the engagement convex parts 23 and maintain the state where the engagement convex parts 23 are locked in the acceptance parts 31 for a longer time period.

The seal material 4 in the present embodiment is compressed such that height Hf of the seal material 4 compressed between the case body part 2 and the lid part 3 is in a range of 40% or more and 80% or less of the height Hi of the uncompressed seal material 4. Setting the amount of compression of the seal material 4 within the above-described specific range allows the repulsive force of the seal material 4 to be appropriately increased when the lid part 3 is attached to the case body part 2 and the seal material 4 is compressed. This further enhances the waterproof performance of the waterproof case 1.

Next, the operational effects of the waterproof case 1 in the present embodiment will be described. The case body part 2 and the lid part 3 of the waterproof case 1 in the present embodiment are locked to each other by snap-fitting where the engagement convex parts 23 are locked in the acceptance parts 31. Thus, the lid part 3 can be attached to the case body part 2 by a simple action of pushing the engagement convex parts 23 into the acceptance parts 31. This reduces the cost necessary for assembly work of the waterproof case 1.

The gap between the case body part 2 and the lid part 3 is sealed by the seal material 4 made of an adhesive silicone gel. This seals the gap between the lid part 3 and the case body part 2 in a liquid-tight manner and maintains the waterproof performance over a long time period.

In the waterproof case 1, the case body part 2 and the lid part 3 are locked to each other by snap-fitting and the seal material 4 made of an adhesive silicone gel is used, so that, after the lid part 3 is attached to the case body part 2, the lid part 3 can be easily removed from the case body part 2. Further, after the removal of the lid part 3 from the case body part 2, attaching the lid part 3 again to the case body part 2 allows for liquid-tight sealing by the seal material 4 of the gap between the two parts.

As described above, according to the waterproof case 1 in the present embodiment, it is possible to provide the waterproof case 1 that that reduces the cost of assembly work, allows for re-assembly, and is excellent in heat-resistance properties and waterproof performance.

Second Embodiment

Figure 3:
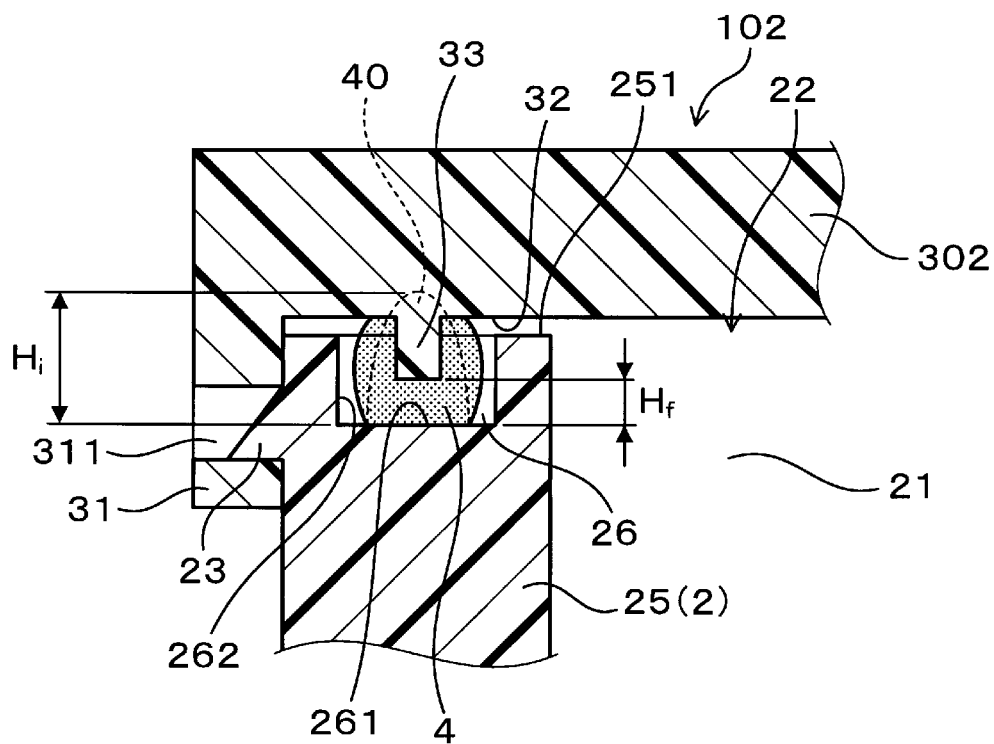
FIG. 3 is a partial enlarged cross-sectional view of parts of a waterproof case in which a projection is press-fitted into a seal material in a second embodiment.

A waterproof case 102 in the present embodiment has a projection 33 that protrudes from the outer peripheral edge of a lid part 302 and is press-fitted into a seal material 4 as illustrated in FIG. 3. Among the reference signs used for the second and subsequent embodiments, the same reference signs as those used for the first embodiment represent components similar to the components and the like in the preceding embodiments.

The waterproof case 102 in the present embodiment has a case body part 2, the lid part 302, and the seal material 4 interposed between the case body part 2 and the lid part 302. The projection 33 protrudes from a position facing a seal material retaining groove 26 in the case body part 2 and the lid part 302 toward a bottom surface 261 of the seal material retaining groove 26, and the projection 33 is preferably press-fitted into the seal material 4. The projection 33 is arranged at the position facing the seal material retaining groove 26. For example, the seal material retaining groove 26 in the present embodiment is arranged at a leading end 251 of a side wall part 25 in the case body part 2. Therefore, the projection 33 in the present embodiment is provided at the position facing the seal material retaining groove 26 in the lid part 302, that is, provided on a seal surface 32.

If the projection 33 is press-fitted into the seal material 4 as in the present embodiment, the height of the portion of the seal material 4 compressed by the projection 33 constitutes a height Hf of the seal material 4 compressed between the case body part 2 and the lid part 302. That is, in the present embodiment, the height of the portion of the seal material 4 compressed by the projection 33 constitutes the height Hf of the seal material 4 compressed over the distance from the bottom surface 261 of the seal material retaining groove 26 to the projection 33. In other respects, the second embodiment is similar to the first embodiment.

Providing the projection 33 as in the present embodiment further increases the amount of compression of the seal material 4 and increases appropriately the repulsive force of the seal material 4, as compared to the configuration without the projection 33. Further, press-fitting the projection 33 into the seal material 4 further increases the area of contact between the projection 33 and the seal material 4 and suppresses more effectively the formation of interstices between the projection 33 and the seal material 4. As a result, the waterproof performance of the waterproof case 102 can be further enhanced. In other respects, the waterproof case 102 in the present embodiment can produce operational effects similar to those of the first embodiment.

Experimental Example 1

The present example is an example of evaluation of waterproof performance of a specimen imitating the above-described waterproof case. In the present example, first, a waterproof case 102 similar in form to that in the second embodiment was prepared. A seal material retaining groove 26 in a case body part 2 was 4.0 mm wide and 2.2 mm deep. A lid part 302 had a projection 33 with a height of 1.5 mm.

A seal material 4 was arranged in the seal material retaining groove 26. The seal material 4 in the present form was made of a silicone gel (hereinafter, called "composition A") by curing a photo-curable silicone composition with a viscosity of 350 Pa·s at 25° C. and a thixotropic ratio of 3.8 at 25° C. The specific components contained in the composition A are as follows.

100 parts by mass of a polyorganosiloxane having a vinylsiloxane group
3.2 parts by mass of a polythiol compound
1.0 part by mass of a photoinitiator
9.0 parts by mass of silica powder The application width of the silicone composition was 3.0 mm, and the application height of the same was 1.7±0.2 mm. After that, the silicone composition was irradiated with light in an accumulated amount of 4500 mJ/cm² to form the seal material 4. The application width and application height $H_1$ of the seal material 4 are identical to the application width and application height of the silicone composition.

Subsequently, engagement convex parts 23 were locked into acceptance parts 31 while the projection 33 was press-fitted into the seal material 4, thereby to attach the lid part 302 to the case body part 2. Accordingly, a specimen A1 was fabricated. In the specimen A1, the height Hf of the seal material 4 with the projection 33 press-fitted was 0.4±0.2 mm.

In the present example, for comparison with the specimen A1, a specimen A2 similar in configuration to the conventional waterproof case 102 was fabricated. Although not illustrated in the drawings, the specimen A2 has an O-ring as a seal material 4 interposed between a case body part 2 and a lid part 302, the case body part 2 and the lid part 302 being fastened together by bolts as fastening members.

Further, in the present example, for comparison with the specimen A1, an attempt was made to produce a specimen A3 by replacing the seal material 4 in the specimen A1 with an O-ring. However, the repulsive force from the O-ring was much higher than the seal material 4 made of a silicone gel. Thus, in the course of pushing the lid part 302 onto the case body part 2, the lid part 302 became deformed when the compression ratio of the O-ring reached about 50%, and the gap between the lid part 302 and the case body part 2 was not sealed in a liquid-tight manner.

The specimen A1 and specimen A2 configured as described above were pressurized such that the internal pressure in the storage space became 10 kPa. Then, these specimens were submitted to a high-temperature exposure test where they were held at a temperature of 130° C. Separately from the high-temperature exposure test, these specimens were submitted to a temperature cycle test where they were held at a temperature of −30° C. for 30 minutes and then held at a temperature of 100° C. for 30 minutes in cycles.

In the high-temperature exposure test, both of the specimens maintained the internal pressure as it was before the start of the test at a point of time when the hold time reached 187.5 hours. In the temperature cycle test, both of the specimens maintained the internal pressure as it was before the start of the test at a point of time when the cycle count reached 600 cycles.

From these results, it can be understood that the specimen A1 has waterproof performance that is equal to or greater than that of the conventional waterproof case 102 with an O-ring.

Experimental Example 2

The present example is an example of evaluation of heat-resistance of a seal material made of a silicone gel. In the present example, a test piece for use in measurement of tensile shear strength was fabricated by a method based on JIS K6850: 1999. Specifically, first, two adherends of PA610 were prepared. The adherends were 80 mm long, 25 mm wide, and 4 mm thick. The above-described composition A was applied to one of the two adherends and cured. The application area of the composition A was 10 mm×15 mm, and the application thickness of the composition A was 3 mm.

The composition A was irradiated with light in an accumulated amount of 4500 mJ/cm² and cured, then the other adherend was stacked onto the cured silicone gel, and then the silicone gel was compressed until its thickness reached 50% of that before stacking.

The thus obtained test piece was submitted to a tensile test with the amount of compression of the silicone gel maintained to measure its shear strength. In addition, the above-described test piece was heated at 120° C., held for a predetermined time, and then submitted to a tensile test to measure its shear strength. The tensile tests were conducted by a method based on JIS K6850: 1999, and the crosshead speed of the tensile tester was 5 mm/minute.

Figure 4:
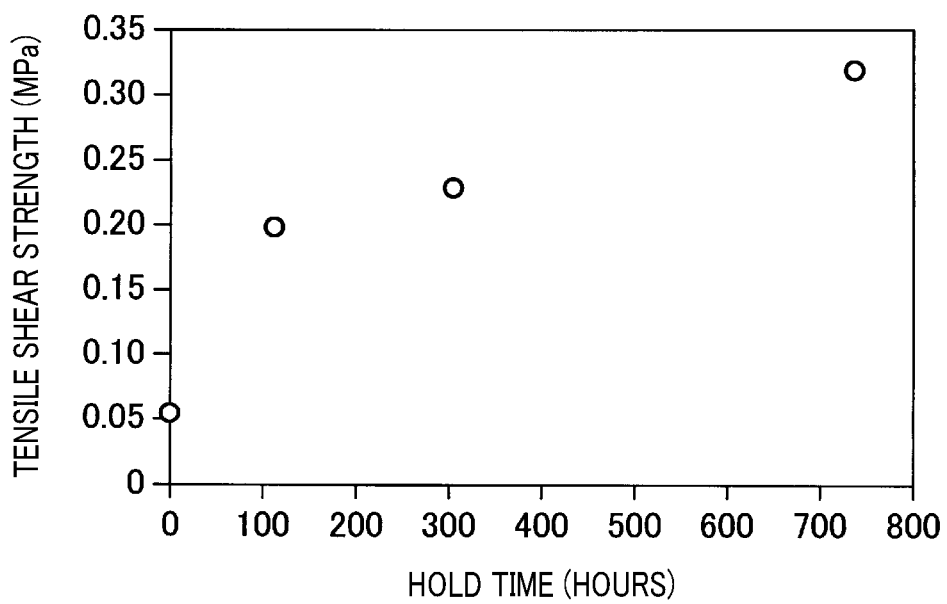
FIG. 4 is an explanatory diagram illustrating results of a heat-resistance test in a second experimental example 2.

The measurement results of shear strength are as shown in FIG. 4. The horizontal axis in the drawing indicates hold time (hour), and the vertical axis indicates shear strength (MPa).

As shown in FIG. 4, the shear strength of the silicone gel was maintained until the hold time exceeded 700 hours at a temperature of 120° C. In this regard, if a conventional waterproof case with an O-ring was submitted to a high-temperature exposure test at a temperature of 120° C., the waterproof case is required to maintain waterproof performance at least until the hold time reaches 700 hours.

Therefore, according to the test results of the present example, by the use of the seal material 4 made of a silicone gel, it can be expected that the waterproof performance of the waterproof case 1 will be maintained over a time period at a level equal to or more than the conventional waterproof case.

The present disclosure is not limited to the embodiments described above but is applicable to various embodiments without departing from the gist of the present disclosure. That is, it should be understood that the present disclosure has been described in accordance with embodiments but is not limited to the embodiments, structures, and the like. The present disclosure also includes various modifications and changes in a range of equivalency. In addition, various combinations and modes, and other combinations and modes including only one element of the foregoing combinations and modes, less or more than the one element are included in the scope and conceptual range of the present disclosure. For example, in the first and second embodiments, the case body part 2 includes the engagement convex parts 23, and the lid part 3, 302 includes the acceptance parts 31. Instead of this, the case body part 2 may include acceptance parts and the lid part 3, 302 may include engagement convex parts. Further, the case body part 2 and the lid part 3, 302 may each include engagement convex parts, and acceptance parts may be provided in accordance with these engagement convex parts.

The structures of the engagement convex parts 23 and the acceptance parts 31 are not limited to the modes in the first and second embodiments but the engagement convex parts 23 and the acceptance parts 31 may have any structures capable of snap-fitting. For example, the engagement convex parts may be locked in the acceptance parts by press-fitting pins as the engagement convex parts into holes as the acceptance parts.

The case body part 2 may not have the seal material retaining groove 26. That is, the seal material 4 may be arranged directly at the leading end 251 of the side wall 25 so that the seal material 4 can be compressed by the seal surface of the lid part 3.

Alternatively, the lid part 3 may have a seal material retaining groove and the seal material 4 may be arranged in the seal material retaining groove.

What is claimed is:

1. A waterproof case for automobile components, comprising:
    a case body part that includes a storage space for housing an object and an opening connecting to the storage space;
    a lid part that is configured to be attached to the case body part to close the opening;
    a seal material that is made of an adhesive silicone gel and is interposed between the case body part and the lid part;
    an acceptance part that is provided in at least one of the case body part and the lid part; and
    an engagement convex part that is provided at a position corresponding to the acceptance part in the case body part and the lid part and is configured to be locked in the acceptance part, wherein:
    at least one of the case body part and the lid part has a seal material retaining groove including a bottom surface and a side surface connecting to the bottom surface;
    the seal material is arranged on the bottom surface of the seal material retaining groove with a clearance from the side surface of the seal material retaining groove and is compressed by the bottom surface and a seal surface of the case body part or the lid part with the engagement convex part and the acceptance part being locked to each other by snap-fitting;
    the clearance is configured to be left between the side surface of the seal material retaining groove and the seal material after compressing the seal material; and
    the seal material is compressed such that a compressed height of the seal material compressed between the bottom surface of the seal material retaining groove and the seal surface of the lid part is in a range of 40% or more and 80% or less of an uncompressed height of the seal material.

2. The waterproof case for automobile components according to claim 1, wherein
    a hardness of the seal material measured by pressing a type-E durometer with a load of 1 kg is in a range of 5 or more and 30 or less.

3. The waterproof case for automobile components according to claim 1, wherein
    a tensile shear strength of the seal material is 0.02 MPa or more.

4. The waterproof case for automobile components according to claim 1, wherein
    the silicone gel is a hardened product of a photo-curable silicone composition containing a thiol cross-linking agent.

5. The waterproof case for automobile components according to claim 1, wherein
    at least one of the case body part and the lid part is made of a resin.

6. The waterproof case for automobile components according to claim 1, wherein
    a projection protrudes from a position facing the seal material retaining groove in the case body part and the lid part toward the bottom surface of the seal material retaining groove, and the projection is press-fitted into the seal material.

7. The waterproof case for automobile components according to claim 1, wherein
    the waterproof case for the automobile components is used in an engine compartment of an automobile.

8. A waterproof case for automobile components, comprising:
    a case body part that includes a storage space for housing an object and an opening connecting to the storage space;
    a lid part that is configured to be attached to the case body part to close the opening;
    a seal material that is made of an adhesive silicone gel and is interposed between the case body part and the lid part;
    an acceptance part that is provided in at least one of the case body part and the lid part; and
    an engagement convex part that is provided at a position corresponding to the acceptance part in the case body part and the lid part and is configured to be locked in the acceptance part, wherein:
    at least one of the case body part and the lid part has a seal material retaining groove including a bottom surface and a side surface connecting to the bottom surface; and
    the seal material is arranged on the bottom surface of the seal material retaining groove with a clearance from the side surface of the seal material retaining groove and is compressed by the bottom surface and a seal surface of the case body part or the lid part with the engagement convex part and the acceptance part being locked to each other by snap-fitting; and
    the clearance is configured to be left between the side surface of the seal material retaining groove and the seal material after compressing the seal material.

\* \* \* \* \*